(12) United States Patent
How et al.

(10) Patent No.: US 6,633,160 B2
(45) Date of Patent: Oct. 14, 2003

(54) FLUXGATE SIGNAL DETECTION EMPLOYING HIGH-ORDER WAVEFORM AUTOCORRELATION

(76) Inventors: Hoton How, 262 Clifton St., Belmont, MA (US) 02478; Carmine Vittoria, 300 Commercial St., Suite 805, Boston, MA (US) 02109

( * ) Notice: Subject to any disclaimer, the term of this patent is extended or adjusted under 35 U.S.C. 154(b) by 27 days.

(21) Appl. No.: 09/837,729

(22) Filed: Apr. 19, 2001

(65) Prior Publication Data

US 2002/0180434 A1 Dec. 5, 2002

(51) Int. Cl.[7] .......................... G01R 33/04; G01C 17/28
(52) U.S. Cl. ....................................................... 324/253
(58) Field of Search ................................. 324/253, 254, 324/255; 702/85, 104, 109

(56) References Cited

U.S. PATENT DOCUMENTS 5,530,349 A * 6/1996 Lopez et al. ................ 324/254

* cited by examiner

Primary Examiner—Walter E. Snow

(57) ABSTRACT

Disclosed is a method for improving the sensitivity of a fluxgate magnetometer for which high-order harmonics are detected and utilized in determining a weak external magnetic field expressed in the core region. These harmonic signals are processed coherently so as to increase the signal-to-noise ratio, since noise can only add to the signal incoherently at these harmonic frequencies. Also disclosed is a method for improving the sensitivity of a fluxgate magnetometer for which the technique of waveform autocorrelation is used in determining a weak external magnetic field expressed in the core region. By convolving the gated signal with a waveform duplicating the signal itself, noise content is effectively suppressed, thereby increasing the resolution power of the fluxgate magnetometer.

5 Claims, 8 Drawing Sheets

$H_o > 0$

FLUXGATE SIGNAL DETECTION EMPLOYING HIGH-ORDER WAVEFORM AUTOCORRELATION

CROSS-REFERENCE TO RELATED APPLICATIONS

Not Applicable

BACKGROUND

1. Field of Invention

This invention is directed to a method of improving the performance of a fluxgate magnetometer sensor employing coherent detection of high-order harmonics of the drive current excited in the sensor core. Equivalently, this invention is directed to a method of improving the sensitivity of a fluxgate magnetometer sensor employing the process for signal auto-correlation so that the signal-to-noise ratio can be thereof increased.

2. Description of Prior Art

A fluxgate magnetometer is a device which measures magnetic fields utilizing the nonlinear magnetic characteristics of the sensor core. Fluxgate magnetometers were first introduced in the 1930's. Early development was for airborne magnetic surveys and for submarine detection during World War II. They were further developed for geomagnetic studies (airborne, seaborne, and underwater), for mineral prospecting, and later for magnetic measurements in outer space. They have also been adapted and developed as various detection and surveillance devices, both for civilian and military use. Despite the advent of newer technologies for magnetic field measurements, fluxgate magnetometers continue to be used successfully in all of these areas, because of their reliability, relative simplicity, economy, and ruggedness.

Since the development of new magnetic materials, the noise figure of these sensors has been reduced to its intrinsic limit. The sensitivity is now approaching the same order of detectability as that of the SQUID (Superconducting QUantum Interference Device) fluxmeter. For example, the sensitivity of fluxgate magnetometers using amorphous magnetic-metal ribbons is in the order of 17 pT at room temperature. The sensitivity of a SQUID device is about 1 pT at liquid helium temperatures (please refer to O. V. Nielsen, B. Herhando, J. R. Tetersen, and R. Primdahl, "Miniaturization of low cost metallic glass fluxgate sensors", J. Mag. Mag. Matr., 83, 405, 1990, for a general review on fluxgate magnetic sensors).

A fluxgate magnetometer requires the sensor core to be excited periodically from one saturation state, with magnetic moment aligned along one direction, to the other saturation state, with magnetic moment aligned along the opposite direction, and vice versa. In the absence of an external field the output signal is zero, due to the symmetry of the core geometry as well as the employed winding of the excitation and detection coil circuits. However, when an external field is applied, the output becomes nonzero, comprising of even harmonics at the drive-current frequency, proportional to the magnitude of the expressed external field. Odd harmonics cancel out as usual due to the symmetry of the sensor device.

In the prior art the fluxgate output signal, or the gated signal, was characterized only at one frequency, and it was usually the second harmonic that was measured via the use of a lock-in amplifier. Harmonics of higher orders were not measured, although they are and were induced in the sensor core and contained in the gated signal. This invention discloses a method which measures the harmonic components of the excitation current up to high orders in a coherent manner. This will increase the signal-to-noise ratio in the detection of the fluxgate device, since noise can only add to the measurement "incoherently" at different harmonic frequencies. Also, this invention discloses a method which performs the process of waveform auto-correlation on the gated signal. The two methods are conjugate methods, one expressed in the frequency domain, and the other in the time domain. Waveform auto-correlation is known to be effective in enhancing the signal-to-noise ratio in measuring weak signals in noisy environments.

Accordingly, it is an objection of the invention to address one or more of the foregoing disadvantages or drawbacks of the prior art, and to provide such improved methods to obtain sensitive fluxgate operation. As such, the sensitivity of the fluxgate sensor can be improved, competing with a more expensive SQUIDS device whose operation requires complicated electronics employed at liquid helium temperatures. Sensitive fluxgate sensors are needed for medical applications, such as in recording cardiograms and electromyograms, and in other applications involving mine detection, navigation, and remote sensing.

Other objects will be apparent to one of ordinary skill, in light of the following disclosure, including the claims.

SUMMARY

In one aspect, the invention provides a method of performing coherent detection of the gated signal at high-order harmonics of the excitation frequency. That is, high-order harmonics are weighted and added coherently so as to minimize noise participation. As a result, noise content is reduced, since noise is mostly averaged out at various harmonic frequencies, thereby increasing the sensitivity.

In another aspect, the invention provides a method of performing signal-waveform auto-correlation on the gated signal of a fluxgate magnetometer. This auto-correlation process is known to be effective in enhancing signal-to-noise ratio in measurements, which can be performed digitally using FFT (Fast Fourier Transform) processors. As it will become clear in the following discussion, the two methods are equivalent: while the former involves frequency-domain measurements, the latter involves time-domain measurements.

BRIEF DESCRIPTION OF THE DRAWINGS

For a more complete understanding of the nature and objects of the present invention, reference is to be made to the following detailed description and accompanying drawings, which, though not to scale, illustrate the principles of the invention, and in which.

DETAILED DESCRIPTION

REFERENCE NUMERALS IN DRAWINGS

| | |
|---|---|
| 110 | Ferromagnetic Core Frame |
| 120 | Pickup-Coil Terminals |
| 121 | Excitation Coil |
| 122 | Pickup Coil |
| 123 | Field-Offset Coil |
| 130 | Source Oscillator |
| 131 | Inductance Compensation Capacitor |
| 132 | Capacitor for Low-Pass Filtering |
| 133 | Summing Resistor |
| 140 | Output Terminal |
| 150 | Coil Support |
| 210 | Power Amplifier |
| 220 | Low-Noise Pre-Amplifier |
| 230 | Summing Amplifier |
| 300 | Frequency Doubler |
| 310, 311, 312, 313, 314, 315, 316, 317 | Counter/Divider |
| 320 | Pulse Generator |
| 330 | Signal Generator |
| 331, 332, 332, 333, 334, 335, 336, 337, 338 | Oscillator |
| 341, 342, 343, 344, 345, 346, 347, 348 | Loading Impedance for Harmonics |
| 410 | Lock-In Amplifier |
| 420 | Mixer |
| 430 | Analogue-To-Digital Converter |
| 440 | Convolution Processor |
| 450 | Register Bank |
| 460 | Switch |

BACKGROUND—FIG. 1A, FIG. 1B, FIG. 1C, FIG. 1D

A fluxgate device contained in the art employs an excitation coil winding around a ferromagnetic core shaped as a toroid, the so-called ring-core fluxgate magnetometer. The pickup coil is located outside enclosing the core and the excitation coil. To operate, an ac drive current is applied to the excitation coil producing a longitudinal magnetic field along the azimuthal or circumferential direction of the core. The drive field excites the core material encompassing the magnetized and the demagnetized states in alternation showing nonlinear variation in magnetic flux. Due to the canceling mechanism of the balanced structure of the coils and the sensor core only even harmonics of the drive current appear at the fluxgate terminals, and it is normally the second harmonic that is measured in the detection scheme.

Figure 1A:
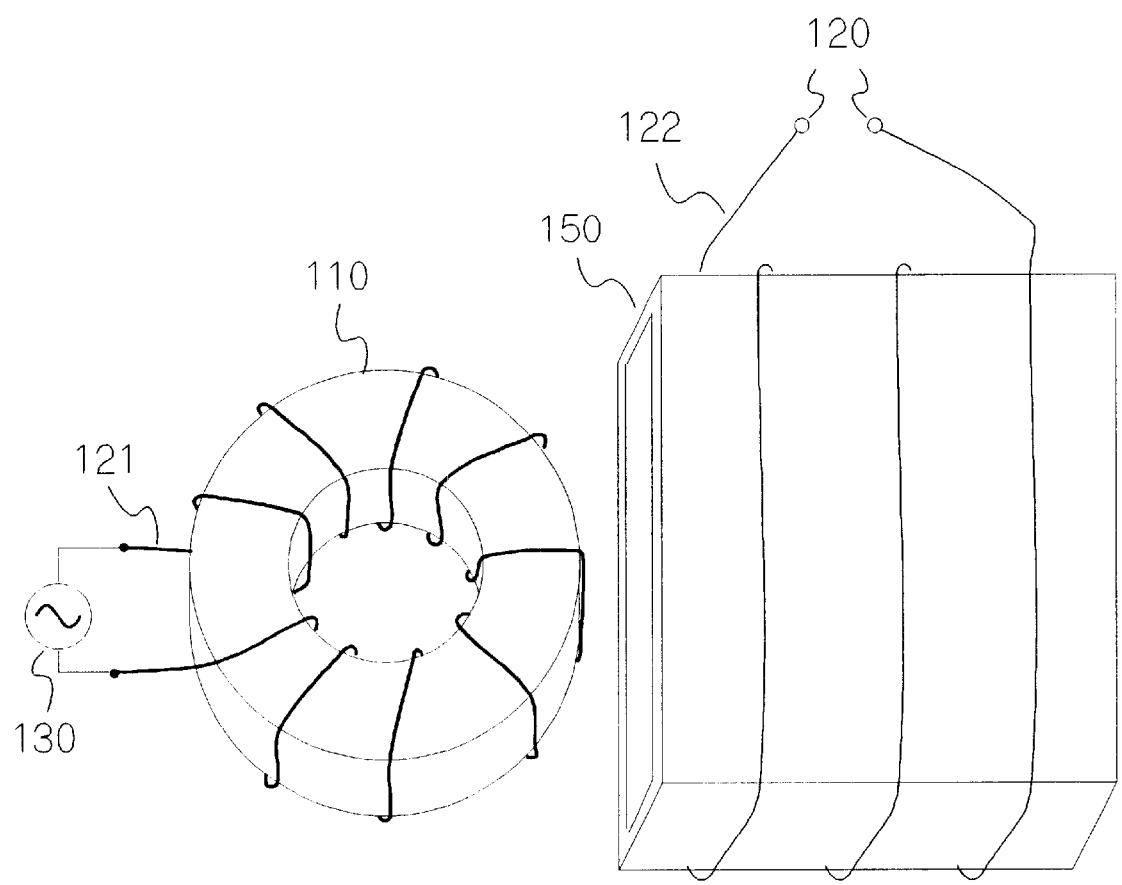
FIG. 1A shows the structure of a ring-core fluxgate magnetometer contained in the prior art.

A ring-core fluxgate magnetometer is shown in FIG. 1A. In FIG. 1A the core 110 is shaped as a toroid consisting of sheets or ribbons of permalloy, or amorphous ribbons with typical composition of iron-boron. A current source 130 is used which feeds the excitation coil 120 winding around the core. The pickup coil 122 winds around a hollow non-magnetic support 250. To operate the assembly of the core 110 plus the excitation coil 121 is inserted into the cavity of the support 250 and the pickup terminals 220 are connected with the detection electronics described in the art measuring even-order harmonics of the current source 130, usually the second harmonic.

Figure 1B:
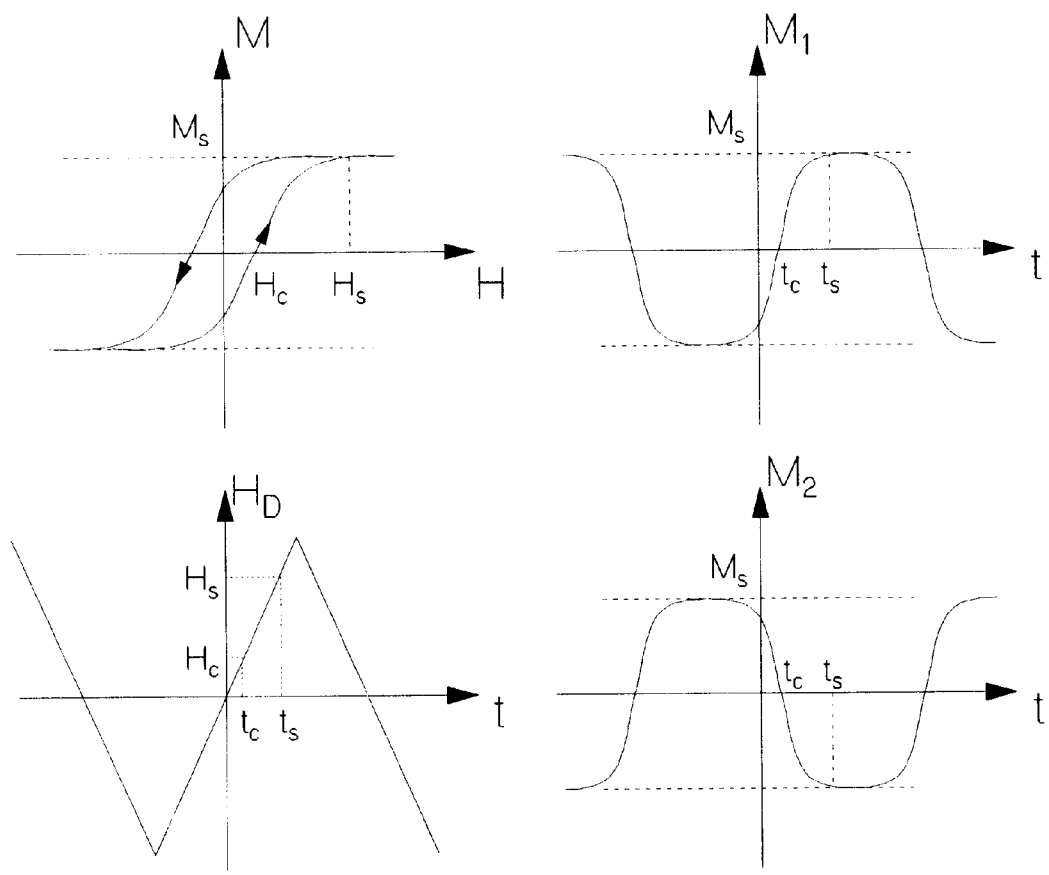
FIG. 1B illustrates the operation of a fluxgate magnetometer with a balanced sensing structure when the external field is zero.

In order to reveal fully the novel features of the present invention, it is informative to first describe the operation of a ring-core fluxgate magnetometer contained in the art. While simple explanations may not be found in the art, FIG. 1B, FIG. 1C, and FIG. 1D demonstrate the working principles enabling the operation of a ring-core fluxgate magnetometer. The magnetization curve, or hysteresis curve, for the core material is given at the upper left of FIG. 1B. In this plot M denotes the magnetization and H the internal field, and a hysteresis loop is shown in the M-H plot with coercive field $H_c$ and saturation field $H_s$. The saturation magnetization is $M_S$. Assume the external field $H_0$ is zero. The drive field $H_D$ then includes only the field generated by the excitation coil 120. The excitation coil 120 is connected with a current source 130 shown in FIG. 1A. Let $H_D$ be a triangular wave whose waveform is shown at the lower left of FIG. 1B. Other periodic waveforms may be equally used. In FIG. 1B $t_c$ and $t_s$ denote the time that $H_D$ reaches $H_c$ and $H_s$, respectively.

In FIG. 1B $M_1$ and $M_2$ denote the magnetization at two corresponding points located at the upper and the lower halves of the core 110, respectively. Waveform for $M_1$, shown at the upper right of FIG. 1B, is derived as the output curve using the M-H plot, the upper left of FIG. 1B, as the transfer curve, and the $H_D$-t plot, the lower left of FIG. 1B, as the input curve. Waveform for $M_2$, shown at the lower right of FIG. 1B, is derived in a similar way, but using the negative of $H_D$ as the input curve, since the magnetization changes direction from the upper half to the lower half of the core. The net magnetization from these two points is $M_{tot}=M_1+M_2$, which is zero due to the symmetry of the ring-core geometry and the manner that the drive field is excited. Thus, by including all the points of the core material the induced electromotive force at the two terminals of the pickup coil 120, FIG. 1A, is zero, if the external field $H_0=0$.

Figure 1C:
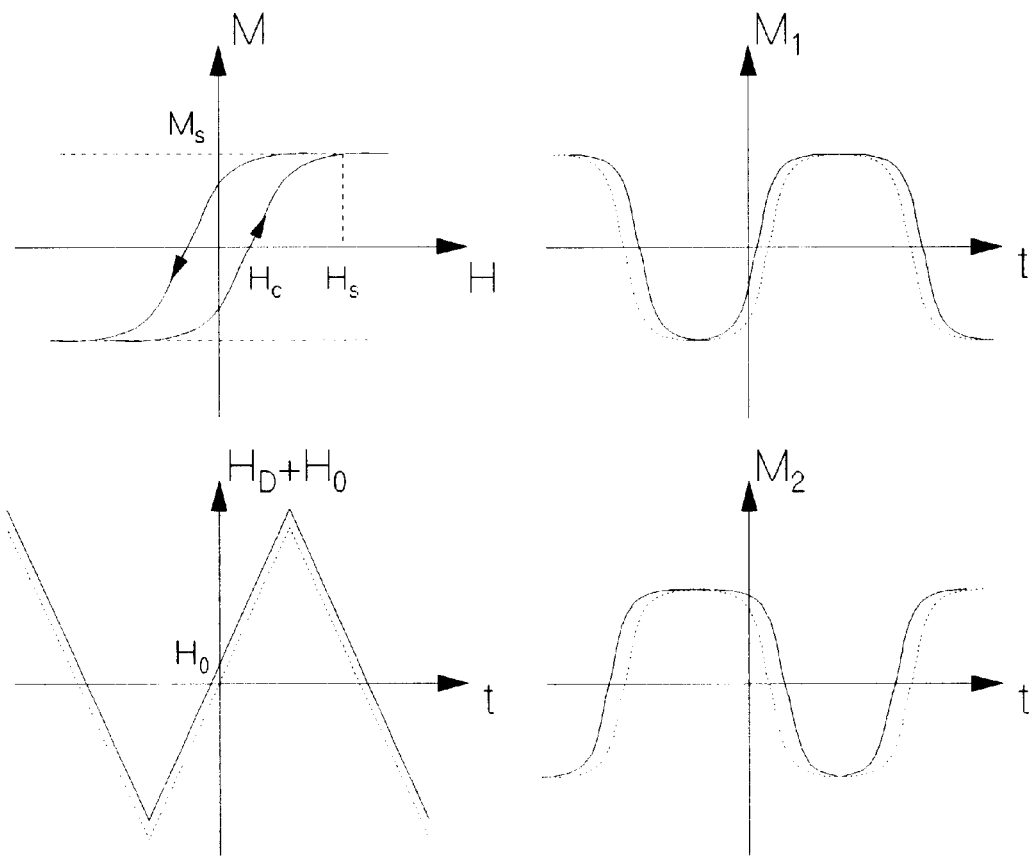
FIG. 1C illustrates the operation of a fluxgate magnetometer with a balanced sensing structure when the external field is greater than zero.
Figure 1D:
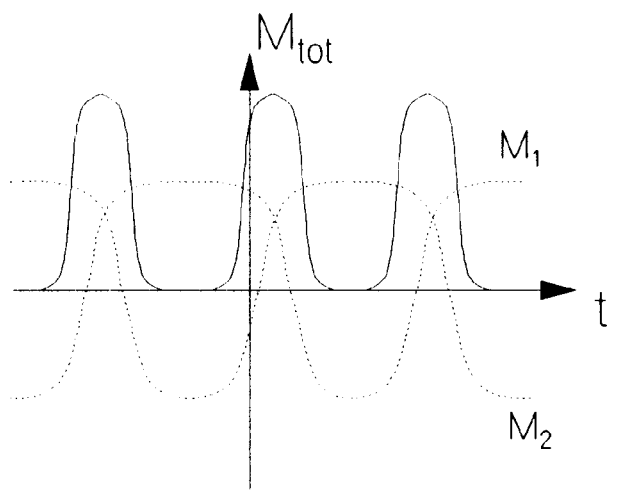
FIG. 1D continues illustrating the fluxgate operation of FIG. 1C. The induced electromotive force at the output terminals of the sensor is proportional to the time-rate change of the total flux enclosed within the pickup coils, appearing as second harmonics of the original driving signal shown in FIG. 1C.
Figure 1D:
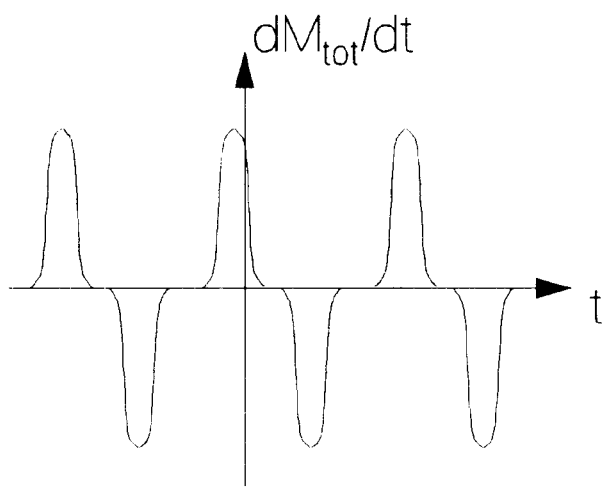

FIG. 1C shows the case where $H_0>0$. The same hysteresis curve is used which is shown at the upper left of FIG. 1C. However, $M_1$ is now derived by using $H_D+H_0$ as the input curve, which is shown as the solid triangular waveform at the lower left of FIG. 1D, and the dashed waveform there denotes $H_D$ only. The resultant waveform for $M_1$ is shown as a solid line at the upper right of FIG. 1C. Analogously, $M_2$ is derived by using $-H_D+H_0$ as the input curve, whose waveform is shown as a solid line at the lower right of FIG. 1C. The dashed curves for both $M_1$ and $M_2$ plots duplicate the original curves shown in FIG. 1B for $H_0=0$ for the purpose of comparison. The total magnetization at these two points is $M_{tot}=M_1+M_2$, which is shown as a solid line at the top of FIG. 1D; the dashed curves in FIG. 1D denote the original $M_1$ and $M_2$ curves shown in FIG. 1C. The resultant electromotive force at the fluxgate terminals is proportional to the time-derivative of $M_{tot}$, which is plotted at the bottom of FIG. 1D. In FIG. 1D it is seen that, when $H_0>0$, the output waveform shows a non-vanishing amplitude whose frequency has been doubled when comparing to the input drive field shown at the lower left of FIG. 1B.

From the above graphical constructions the following points are concluded: A voltage pulse is generated at the pickup terminals whenever the saturation-transition region is encompassed during core excitation. The pulse polarity depends on the sign of the curvature of the magnetization curve at the saturation points, denoted as $C_s$, and the direction of the magnetization process. Thus, two voltage pulses are released for each sweep of the magnetization process along one direction, one pointing upward and the other downward, and for a full-cycle excitation four pulses are generated, explaining the frequency-doubling mechanism for fluxgate operation. The pulse width is proportional to $H_0+H_A$, where $H_A$ denotes the width of the saturation-transition region occurring in the magnetization process, and the slew rate of the pulse is proportional to $C_s$. The pulse height is proportional to $H_0$ if $H_0<<H_A$, and the pulse height saturates at a value proportional to the slope of the magnetization curve at the coercive point, if $H_0>>H_A$.

Thus, when $H_o$ is quasi-static, detection of $H_0$ then involves the measurement of a sequence of alternating pulses appearing at twice the excitation frequency. Traditional detection involves the use of a lock-in amplifier which is phase locked at the second harmonic frequency with proper delay-time adjustment, $t_c$ shown in FIG. 1B. However, it is evident that higher-order harmonics are also generated in the core region which are ignored in traditional measurement techniques or methods. The detection sensitivity can be improved significantly if harmonics of all orders are included in the detection scheme. This forms the object of this invention, which will be further discussed in the following sections.

The essential features for fluxgate operation are summaries as follows:

(1) The output pickup voltage is zero if $H_0$ is zero for a balanced or a symmetrical fluxgate sensor device.

(2) $H_0$ is parallel to $H_D$ in one half of the core, but anti-parallel in the other half of the core; this allows for other possible fluxgate-core/excitation-current geometries to be constructed, not necessarily to be the one shown in FIG. 1A.

In this analysis, hysteretic effects are accounted for by including a time delay, $t_c$, in the output waveforms, for example, as shown in FIG. 1B. Although discussions in this Section assumed a triangular excitation current, other current waveform excitations can also be used, and similar results shown in FIG. 1D can be derived provided that the magnetization curve is scaled or transferred accordingly in a manner as described in the discussion of FIG. 1B and FIG. 1C.

Figure 2A:
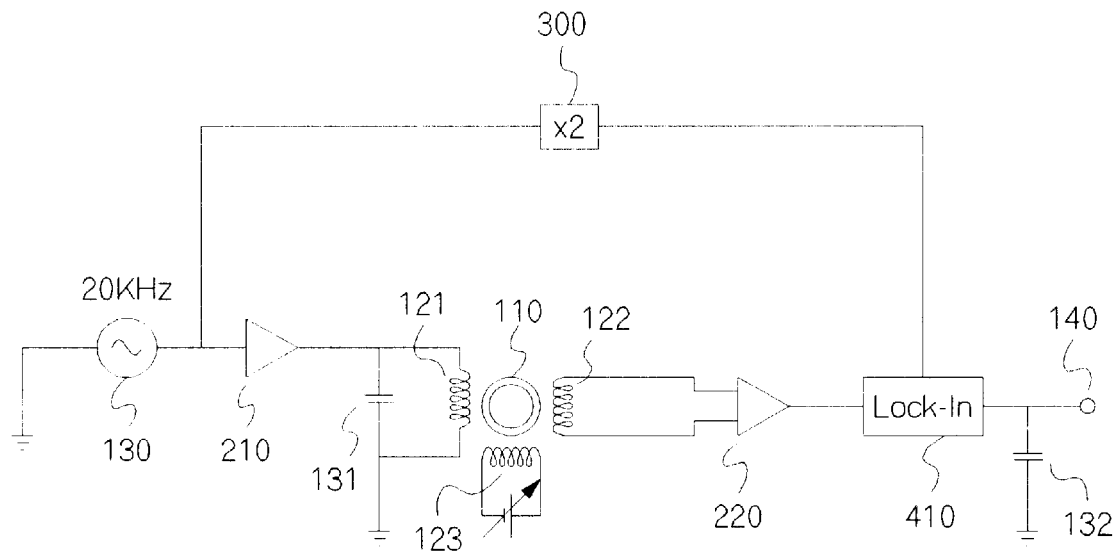
FIG. 2A shows the schematic of the detection electronics contained in the prior art for which a lock-in amplifier is used operating at the second harmonic frequency. To be explicit, the driving frequency is set at 20 KHz.
Figure 2B:
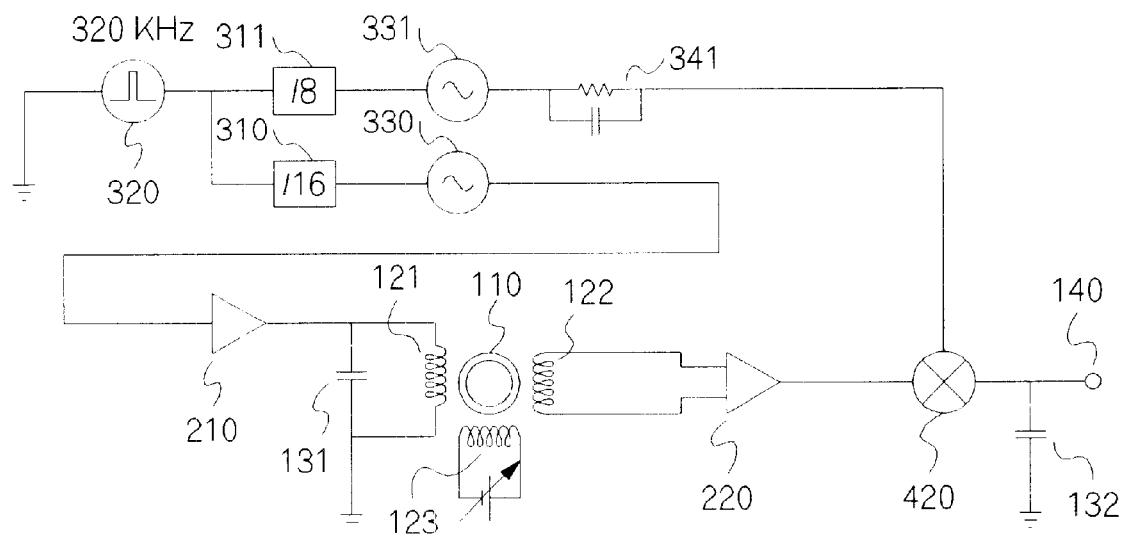
FIG. 2B shows an equivalent of FIG. 2A for which the lock-in amplifier has been replaced by their composite elements to be compared with those shown in FIG. 3.

Prior Art—FIG. 2A, FIG. 2B

The operation of a fluxgate magnetometer contained in the art requires the core material to be excited by a drive magnetic field encompassing the demagnetized states and the magnetized states of the core in alternation. This generates magnetic noise, since irreversible domain-wall motion takes place appreciably at the knee before reaching saturation, identified as Barkhausen jumps or discontinuities. It is these magnetic discontinuities that limit the resolution power of a fluxgate magnetometer sensor device (please refer to: H. How, T. -M. Fang, C. Vittoria, "Modeling of Barkhausen Noise in Magnetic Core Material—Application of Preisach Model," J. Appl. Phys., 81(8), 5594, 1997).

Traditional detection of fluxgate signals involves the use of a lock-in amplifier phase-locked at the second-order harmonic frequency. This is shown in FIG. 2A. In FIG. 2A a signal source, 130, is operating at, say, 20 KHz, feeding into a power amplifier, 210, to drive the excitation coil, 121, winding around the sensor core, 110. The pickup coil, 122, which contains the gated signal, is fed into a low-noise pre-amplifier, 220, connected to a lock-in amplifier, 410, performing coherent detection at the second-order harmonic frequency. This is achieved via the use of a frequency doubler, 300, phase-locked to the signal source, 130. The output signal is then sampled at the output terminal, 140. In FIG. 2A two auxiliary capacitors are also shown, 131 and 132. Capacitor 131 is used to compensate the inductance of the excitation coil, 121, at least partially, so as to reduce the current drive to the sensor core. Capacitor 132 is used to shunt away the ac part of the detection signal so as to narrow the detection bandwidth, thereby reducing the content of noise.

In order to account for the residue field, or remanence, in the core region an offset field may be needed. Also, there is a need to compensate the external field $H_o$ so as to null the output voltage at the output terminal 140. For these purposes a compensating or an offsetting coil is shown in FIG. 2A, coil 123, generating a dc field in the core region compensating or offsetting the external field $H_o$ and the residue field, facilitating sensitive measurement of a weak field $H_o$. Coil 123 is called field-offset coil, which is connected to a variable dc voltage supply.

FIG. 2B is actually the same as FIG. 1A, except that the lock-in amplifier, 410, is decomposed in smaller units resembling the circuit of the present invention to be discussed in the next section. In FIG. 2B a pulse generator, 320, is used to generate both the excitation current and the lock-in reference. To be explicit, the pulse generator, 320, is operating at 320 KHz, and the generated pulse sequence is counted down by a factor of 16 and 8 using two counters, 310 and 311, respectively. The former pulse sequence at 20 KHz repetition rate is used to trigger a signal source, 330, generating the same waveform for the driving current as the signal source 130 does shown in FIG. 2A. The latter pulse sequence at 40 KHz repetition rate triggers an oscillator, 331, generating sinusoidal second-order harmonic waveforms phase-locked with the excitation current. Impedance network, 341, is used to adjust the amplitude and phase of the second-order harmonic reference, accounting for possible time delay arising from the hysteretic nature of the core material exercising magnetic excitation. After the low-noise pre-amplifier 220, the output signal, or the gated signal, is mixed with the harmonic reference via the use of a mixer, 420, and the dc output is sampled at the terminal 140. The rest of the circuit is the same as that shown in FIG. 2A.

In FIG. 2B it is seen that only a fraction of the signal spectrum is used in the determination of the external field $H_o$ expressed in the core region. That is, only the lowest-order harmonics of the gated signal is utilized, leaving behind all of the other higher order harmonics not measured. The measurement scheme of FIG. 2B is thus incomplete. In fact, by detecting, coherently, many orders of the harmonics of the gated signal, the detection resolution power can be enhanced, since noise voltages are uncorrelated at the higher harmonic frequencies. This forms the basis of the present invention.

Method of High-Order Detection—An Analogue-Circuit Approach

Figure 3:
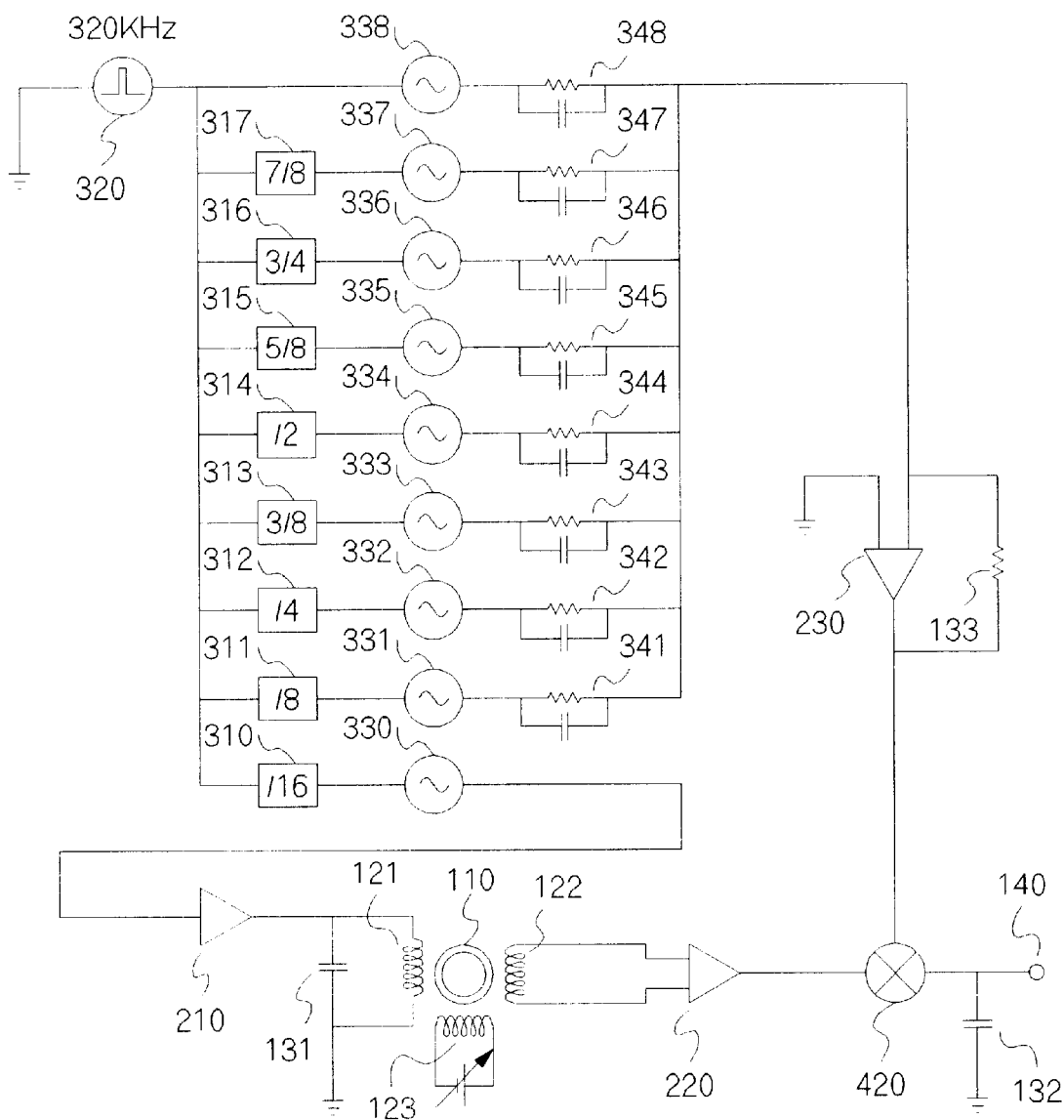
FIG. 3 shows the schematic of the detection electronics providing coherent detection of the fluxgate signal for harmonics of many orders.

FIG. 3 shows a generalization of the circuit of FIG. 2B representing the prior art. That is, instead of incorporating only the second harmonic component in the detection scheme, higher orders can be equally included performing coherent detection. Eight such harmonic components are shown in the detection circuit of FIG. 3, for example. Counters 311, 312, 313, 314, 315, 316, 317 count down the common pulse sequence generated by a pulse generator 320 by a factor of ⅛, ¼, ⅜, ½, ⅝, ¾, ⅞, feeding them into respective oscillators 331, 332, 333, 334, 335, 336, 337. Oscillator 338 is fed directly from the pulse generator 320, which assumes a pulse repetition rate of 320 KHz. The fluxgate core is driven at 20 KHz, since the common pulse sequence generated from the pulse generator 320 has been counted down by a factor of 1/16 via counter 310 connected to a function generator 330. Thus, oscillators 331, 332, 333, 334, 335, 336, 337, 338 generate $2^{nd}$, $4^{th}$, $6^{th}$, $8^{th}$, $10^{th}$, $12^{th}$, $14^{th}$, $16^{th}$ harmonics driving current, respectively. These harmonic components are fed into respective loading impedances 341, 342, 343, 344, 345, 346, 347, 348 and summed up by a summing amplifier, 230. Finally, the sum signal from the summing amplifier 230 is fed into a mixer 420, mixing with the gated signal collected from the pickup coil 122, performing coherent signal detection. In FIG. 3 register 133 denotes the summing resistor. The other circuit elements are the same as before as shown in FIG. 2B.

The remaining question is how to set up or choose the loading impedances 341, 342, 343, 344, 345, 346, 347, 348 for the generated harmonics of various order. The key is that the synthesized waveform from the summing amplifier 230 duplicates in scale the original signal waveform collected from the pickup coil. As such, the mixing process performed in the mixer 420 is called waveform auto-correlation, which has been known to be effective in increasing the signal to noise ratio in the detection of a weak signal. In order words the detection scheme shown in FIG. 3 performs high-order coherent detection so that noise generated at individual harmonic frequencies are in large averaged out, since noise can only be added incoherently at these harmonic frequencies.

Loading impedances 341, 342, 343, 344, 345, 346, 347, 348 can be determined either from calculation or from measurements. If the core material is well characterized, including its shape, hysteresis curve, conductivity, etc., it is possible to calculate the waveform of the gated signal in the presence of an external field $H_o$, as discussed in the previous section serving as the background of this invention. When the shape of the signal waveform is known, the loading impedances 341, 342, 343, 344, 345, 346, 347, 348, relative to the resistance of the summing resistor 133, are proportional to the Fourier coefficients of the waveform at the $2^{nd}$, $4^{th}$, $6^{th}$, $8^{th}$, $10^{th}$, $12^{th}$, $14^{th}$, $16^{th}$ harmonic frequencies, respectively. Note that these Fourier coefficients are complex numbers due to the lossy feature of the core material, say, conductivity loss and hysteresis loss, implying that the loading impedances 341, 342, 343, 344, 345, 346, 347, 348 need to contain both resistive and capacitive components, as shown in FIG. 3

Alternatively, the loading impedance 341, 342, 343, 344, 345, 346, 347, 348 can be measured by using a spectrum analyzer. As discussed in the BACKGROUND section, the gated signal waveform will not change if $H_o<H_A$. The gated signal waveform is thus obtainable by applying a tentative field using the field-offset coil 123, whose magnitude is smaller than $H_A$, but much greater the noise level. This is possible, since $H_A$ is in the order of 0.01 to 0.1 Oe, depending on the core material used. The output waveform from the pre-amplifier 220 is averaged for many cycles so as to minimize noise contribution. The averaged signal waveform is then fed into a spectrum analyzer whose Fourier components at the $2^{nd}$, $4^{th}$, $6^{th}$, $8^{th}$, $10^{th}$, $12^{th}$, $14^{th}$, $16^{th}$ harmonic frequencies determine the value of the loading impedances 341, 342, 343, 344, 345, 346, 347, 348, respectively.

The value of the loading impedances 341, 342, 343, 344, 345, 346, 347, 348 can also be measured without using a spectrum analyzer; they can be determined sequentially by using the circuit diagram of FIG. 3. As before, a tentative field is applied by the field-offset coil 123, whose magnitude is, again, smaller than $H_A$, but much larger than the noise level. The impedance value of 341 is set arbitrarily, giving rise to the proportional constant not critical to the overall measurement. This proportional constant can also be changed by varying the value of the summing resistor, 133. The loading impedance 342 is determined by minimizing the output reading at the output terminal 140, while the other impedances 343, 344, 345, 346, 347, 348, are set at open circuit. The values of loading impedance 344, 345, 346, 347, 348 are determined in a similar way. For example, loading impedance 343 is determined by minimizing the output reading at the output terminal 140, while setting impedances 341 and 342 at fixed values and impedances 344, 345, 346, 347, 348 at open circuit, and so on. The above process is valid, since all of the Fourier components are orthogonal to each other in the Hilbert space spanned by the output signals.

Method of High-order Detection—A Digital-circuit Approach

Figure 4:
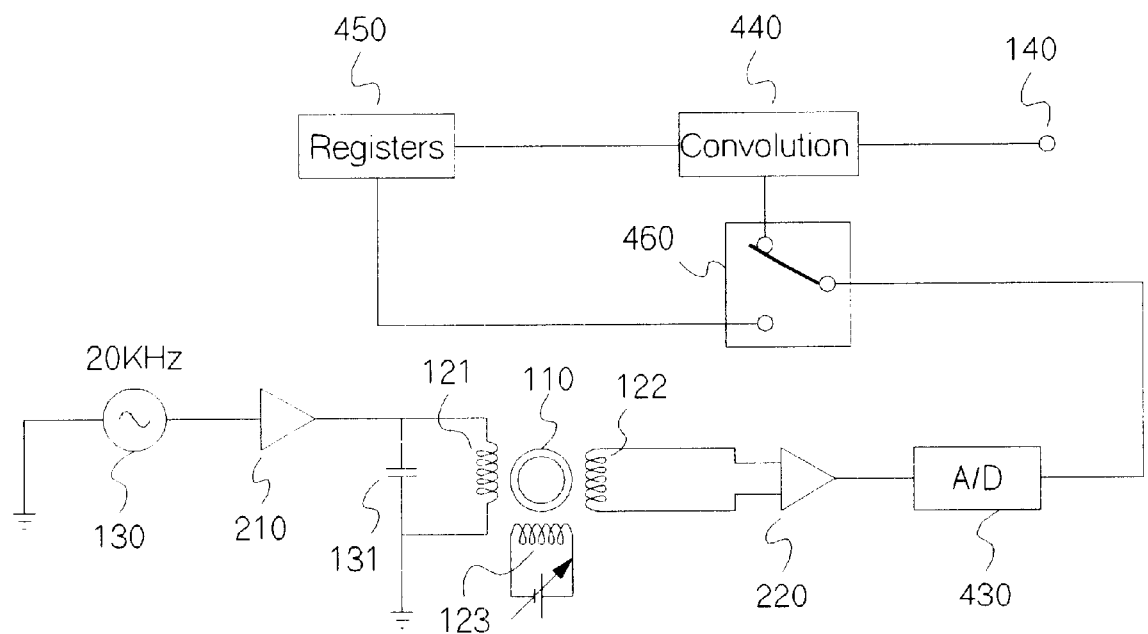
FIG. 4 shows an alternative of FIG. 3 involving digital processors performing coherent detection of the fluxgate signal. Autocorrelation of the signal is realized in the process for waveform convolution.

Waveform auto-correlation can also be performed using digital processors. This is shown in FIG. 4. In FIG. 4 the gated signal following the pre-amplifier 220 is fed into an analog-to-digital converter 430 for subsequent digital analysis. The process of autocorrelation requires the waveform shape to be first recorded. As before, this can be done by applying a tentative signal using the field-offset coil 123, which, after averaging over many cycles, is then stored in the register bank 450. During this storage process the switch 460 is set on for the register band 450, but off for the convolution processor 440. In performing waveform auto-correlation the switch 460 is set on for the convolution processor, but off for the register bank 450. Thus, in the presence of a weak signal $H_o$ to be determined the gated signal from the pickup coil 122 undergoes convolution with the pre-recorded waveform in proportion to the signal itself so as to minimize noise participation. Note that, the convolution processor employs FFT circuits and hence it can be a fast device.

Let the output signal from the fluxgate be f(t), and the characteristic waveform of the fluxgate be g(t). For a given fluxgate care material with known magnetization curves under excitation of a given current waveform, g(t) can be calculated in a manner outlined in the BACKGROUND Section, whose typical time-dependence is shown at bottom of FIG. 1D. Otherwise, g(t) can be directly measured and recorded by impressing onto the core region an external magnetic field of a moderate magnitude. To perform time-domain signal autocorrelation, it is equivalent to evaluate the following time-domain integral:

$$V_{out} = \int_0^T f(t) \cdot g(t) \, dt, \qquad (1)$$

where T denotes the period of core excitation. The above time-domain integration can also be carried out in the frequency domain. To do it, g(t) needs to be expressed in terms of high-order harmonics of core excitation:

$$g(t) = \sum_{k=1}^{\infty} [a_{2k}\cos(2\pi kt/T) + b_{2k}\sin(2\pi kt/T)] \quad (2)$$
$$= \sum_{k=1}^{\infty} c_{2k}\cos(2\pi kt/T + \phi_{2k}),$$

where $a_{2k}$ and $b_{2k}$ are Fourier coefficients and $$c_{2k} = (a_{2k}^2 + b_{2k}^2)^{1/2}, \quad \phi_{2k} = \tan^{-1}(a_{2k}/b_{2k}). \quad (3)$$

If the functional dependence of g(t) is known, coefficients $a_{2k}$ and $b_{2k}$, and hence $C_{2k}$ and $\phi_{2k}$, are thus all determined. As discussed previously, in Eq.(2) only even harmonics appear, characteristic of fluxgate operation. In terms of Eq.(2), Eq.(1) can now be rewritten as $$V_{out} = \sum_{k=1}^{\infty} \int_0^T f(t) \cdot [c_{2k}\cos(2\pi kt/T + \phi_{2k})]dt. \quad (4)$$

While fluxgate time-domain measurement of Eq. (1) is realized using an electronic circuit shown in FIG. 4, frequency-domain analysis is performed according to FIG. 3. From Eq.(4), it is clear that the two measurement schemes shown in FIG. 3 and FIG. 4 are identical. The conventional fluxgate measurement contained by the art invokes only the lowest-order fluxgate characterization, involving only the second harmonics in Eq.(4). Thus, by including high-order terms, or by exploiting waveform autocorrelation, the signal-to-noise ratio of the measurement can be increased, since noise is added to the signal incoherently at high-order harmonic frequencies.

We claim:

1. A method of improving the sensitivity of a fluxgate magnetometer, comprising:

utilizing the full harmonic content furnished by the fluxgate signal accompanying nonlinear excitation of the core material not necessarily to be restricted to the detection and characterization of one component or a few components of the high-order harmonics of the fundamental frequency, wherein by invoking a predetermined electronic scheme the signal-to-noise ratio is thus enhanced, thereby improving said sensitivity of said fluxgate magnetometer.

2. The method of claim 1 wherein said predetermined electronic scheme includes employing waveform autocorrelation using either a digital circuit or an analog circuit or both by which said fluxgate signal accompanying said nonlinear excitation of said core material convolves with a waveform either to be entered in real time or to be fetched from a storage medium.

3. The method of claim 2 wherein said waveform to be convolved with said fluxgate signal duplicates in scale said fluxgate signal but contains a less harmonic-content for a noise-free signal, to be obtained from calculations or measurements or both.

4. The method of claim 2 wherein said waveform to be convolved with said fluxgate signal duplicates in scale said fluxgate signal is obtained by applying a tentative magnetic field of considerable magnitude onto the core region of said fluxgate magnetometer.

5. The method of claim 2 wherein said waveform autocorrelation is realized using digital signal processors performing waveform filtration or matched filtration.

* * * * *